United States Patent
Chou

(10) Patent No.: US 9,184,059 B2
(45) Date of Patent: Nov. 10, 2015

(54) METHOD FOR INCREASING PATTERN DENSITY

(71) Applicant: INOTERA MEMORIES, INC., Taoyuan (TW)

(72) Inventor: Kuo-Yao Chou, Taichung (TW)

(73) Assignee: INOTERA MEMORIES, INC., Hwa-Ya Technology Park Kueishan, Taoyuan (TW)

( * ) Notice: Subject to any disclaimer, the term of this patent is extended or adjusted under 35 U.S.C. 154(b) by 117 days.

(21) Appl. No.: 14/221,301

(22) Filed: Mar. 21, 2014

(65) Prior Publication Data

US 2015/0270141 A1    Sep. 24, 2015

(51) Int. Cl.
 *H01L 21/00* (2006.01)
 *H01L 21/311* (2006.01)

(52) U.S. Cl.
 CPC .... *H01L 21/31144* (2013.01); *H01L 21/31116* (2013.01)

(58) Field of Classification Search
 CPC .............. H01L 21/76802; H01L 21/76843
 USPC ................................................ 438/637, 694
 See application file for complete search history.

(56) References Cited

U.S. PATENT DOCUMENTS

| | | | | |
|---|---|---|---|---|
| 6,066,569 A | * | 5/2000 | Tobben | H01L 21/31144 257/E21.257 |
| 7,435,673 B2 | * | 10/2008 | Lee | H01L 21/76801 257/E21.576 |
| 7,737,039 B2 | * | 6/2010 | Sandhu | H01L 21/0337 438/696 |
| 8,372,740 B2 | | 2/2013 | Xu | |
| 2010/0319759 A1 | * | 12/2010 | Fisher | H01L 31/0296 136/252 |
| 2012/0085733 A1 | * | 4/2012 | Mebarki | H01L 21/0338 216/37 |
| 2013/0065397 A1 | * | 3/2013 | Chen | H01L 21/0337 438/703 |

FOREIGN PATENT DOCUMENTS

TW            201207899        2/2012

* cited by examiner

*Primary Examiner* — Jami M Valentine
(74) *Attorney, Agent, or Firm* — Winston Hsu; Scott Margo

(57) ABSTRACT

A method of fabricating a semiconductor device includes the steps of providing a hard mask cover using a patterned photoresist layer, wherein the patterned photoresist layer comprises at least four first holes arranged in two rows and two columns. Part of the hard mask is removed to form at least four second holes by taking the pattered photoresist layer as a mask. Next, each of the first holes is widened, and the widened first holes and the second holes are filled up by a filler. Later, the patterned photoresist layer is removed entirely. Part of the hard mask is removed to form at least a fourth hole by taking the filler as a mask. Finally, the filler is removed entirely.

10 Claims, 6 Drawing Sheets

METHOD FOR INCREASING PATTERN DENSITY

BACKGROUND OF THE INVENTION

1. Field of the Invention

The present invention relates generally to a method for increasing pattern density, and more particularly to a method of using a single photo mask and a single shot to form a dense pattern.

2. Description of the Prior Art

Many factors, including demand for increased portability, computing power, memory capacity and energy efficiency, have led to integrated circuits being continuously reduced in size.

This means that density of semiconductor elements on a wafer has increased with the advancements in the semiconductor industry. In particular, miniaturization of microelectronic elements has made the intervals between elements shorter and shorter, which increases the difficulty of a lithographic process.

The lithographic process is commonly used to pattern features. Due to factors such as optics and the wavelength of light used to pattern the features, lithographic techniques have a resolution limitation.

For current lithographic tools, it is impossible to create semiconductor elements with pitch lower than the resolution limitation in one exposure. The current solution is that the desired semiconductor elements are patterned by two exposures using two photo masks, respectively, on a photo resist layer. This process is then followed by one etching step. The current method incurs a high processing cost, however.

SUMMARY OF THE INVENTION

It is an objective of the present invention to provide an improved method to fabricate a denser pattern on a substrate while avoiding the problems described above.

According to a preferred embodiment of the present invention, a method of fabricating a semiconductor device comprises providing a substrate covered by a hard mask and a patterned photoresist layer, wherein the patterned photoresist layer comprises at least four first holes arranged in two rows and two columns. Then, part of the hard mask is removed to form at least four second holes in the hard mask by taking the pattered photoresist layer as a mask. Next, each of the first holes is widened. Thereafter, the widened first holes and the second holes are filled up by a filler. Later, the patterned photoresist layer is removed entirely and part of the hard mask is exposed through the widened first holes. Part of the hard mask is then removed to form at least a fourth hole by taking the filler as a mask. Finally, the filler is removed entirely.

According to another preferred embodiment of the present invention, a method of fabricating a semiconductor device comprises providing a hard mask covered by a patterned photoresist layer, wherein the patterned photoresist layer comprises numeral first holes arranged in numeral rows and numeral columns. Later, the hard mask is partly removed by taking the patterned photoresist layer as a mask to form numeral second holes arranged in several rows and several columns in the hard mask. The first holes are widened to make all the widened first holes communicate together. Next, a filler is used to fill in the widened first holes and the second holes. Subsequently, the patterned photoresist layer is entirely removed and the hard mask is exposed. Finally, the hard mask layer is partly removed by taking the filler as a mask to form numeral third holes in the hard mask.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 6 depict steps of fabricating a semiconductor device from a top view according to one embodiment of the invention, wherein:

DETAILED DESCRIPTION

To better understand and appreciate the invention, FIG. 1 to FIG. 6 depict steps of fabricating a semiconductor device from a top view according to one embodiment of the invention. Cross-sectional views taken along line AA' in FIG. 1 to FIG. 6 are respectively shown in FIGS. 1A, 2A, 3A, 4A, 5A, 6A. Cross-sectional views taken along line BB' in FIG. 3 to FIG. 6 are respectively shown in FIGS. 3B, 4 B, 5B and 6B.

Figure 1:
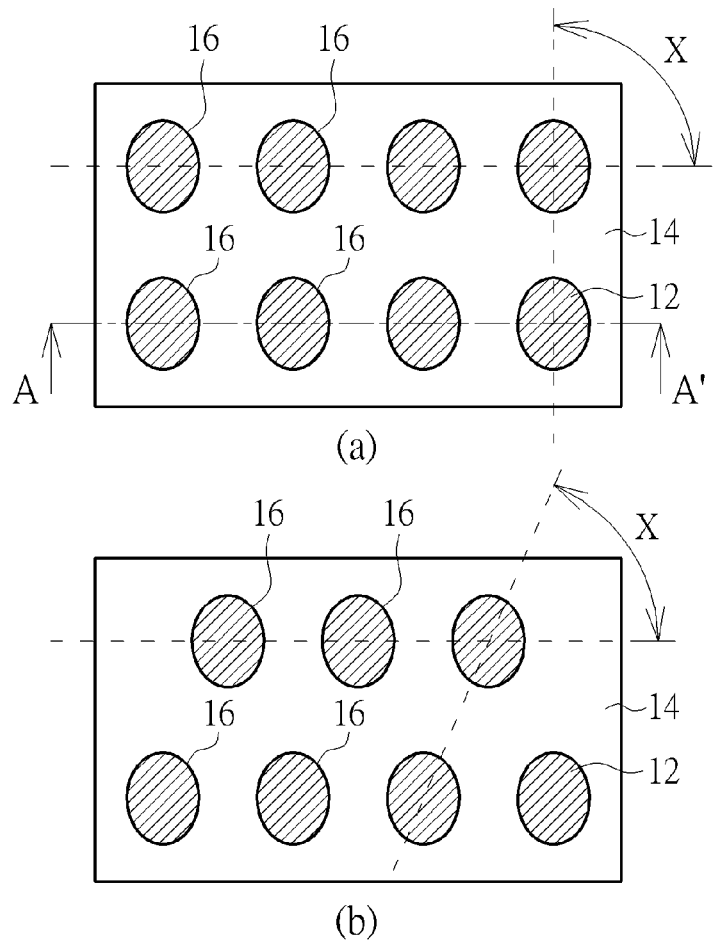
Figure 1A:
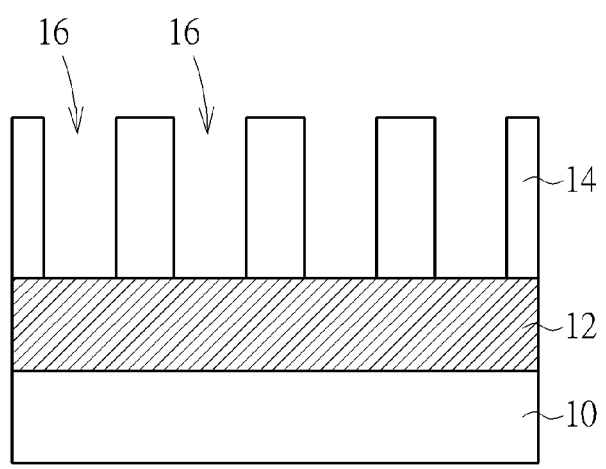
FIG. 1A, FIG. 2A, FIG. 3A, FIG. 4A, FIG. 5A and FIG. 6A depict the cross-sectional views taken along line AA' in FIG. 1 to FIG. 6 respectively.

As shown in FIG. 1 and FIG. 1A, the method starts by providing a substrate 10 covered by a hard mask 12 and a pattered photoresist layer 14. The pattered photoresist layer 14 is disposed on the hard mask 12. The substrate 10 maybe a bulk silicon substrate, a germanium substrate, a gallium arsenide substrate, a silicon germanium substrate, an indium phosphide substrate, a gallium nitride substrate, a silicon carbide substrate, a silicon on insulator (SOI) substrate, dielectrics, metals, or other suitable materials. The hard mask 12 may be silicon nitride, silicon oxide, silicon oxynitride or other suitable materials. Please refer to the embodiment (a) of FIG. 1, the patterned photoresist layer 14 includes at least four holes 16 arranged in two rows and two columns. There is an angle x between one of the rows and one of the column. The angle x is sustainably 90 degrees. According to another preferred embodiment of the present invention, the angle x may be smaller than 90 degrees as shown in the embodiment (b) of FIG. 1. The following fabricating method will illustrated by taking the embodiment (a) of FIG. 1 as an example. Preferably, there can be more than four holes 16 arranged in several rows and several columns in the patterned photoresist layer 14. The hard mask 12 is exposed through the holes 16. The patterned photoresist layer 14 can be formed by standard lithographic techniques with a conventional photo mask and with a single shot of a scanner tool.

Figure 2:
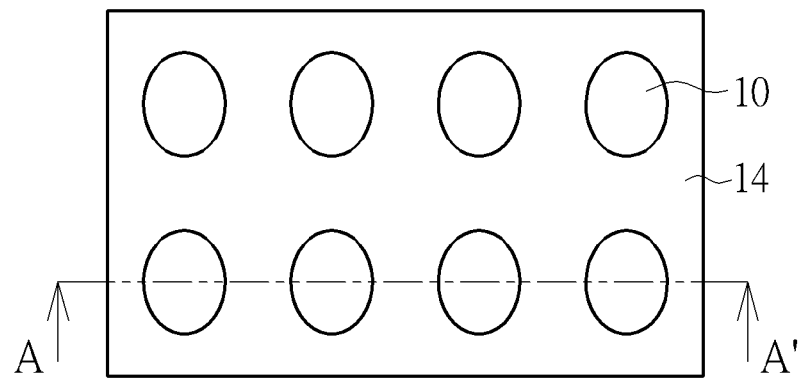
Figure 2A:
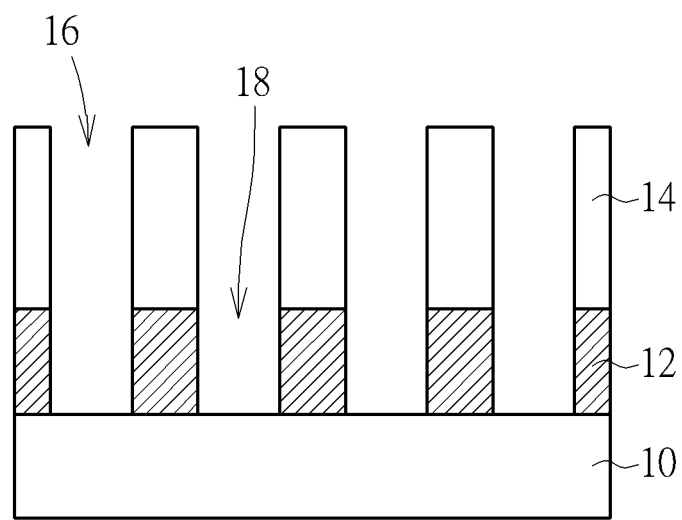

Please refer to FIG. 2 and FIG. 2A. The holes 16 on the patterned photoresist layer 14 are transferred onto the hard mask 12 to form holes 18. The holes 18 may be circular, rectangular, polygonal or other suitable shapes. The transferring step may be performed by removing part of the hard mask 12 by taking the patterned photoresist layer 14 as a mask. The hard mask 12 may be removed partly by a dry etch, and at least four holes 18 corresponding to the holes 16 are formed in the hard mask 12. Preferably, there can be more than four holes 18 arranged in numerous rows and numerous columns in the hard mask 12. At this point, each of the holes 16 communicates with a corresponding hole 18 and the substrate 10 is exposed through the holes 16/18.

Figure 3:
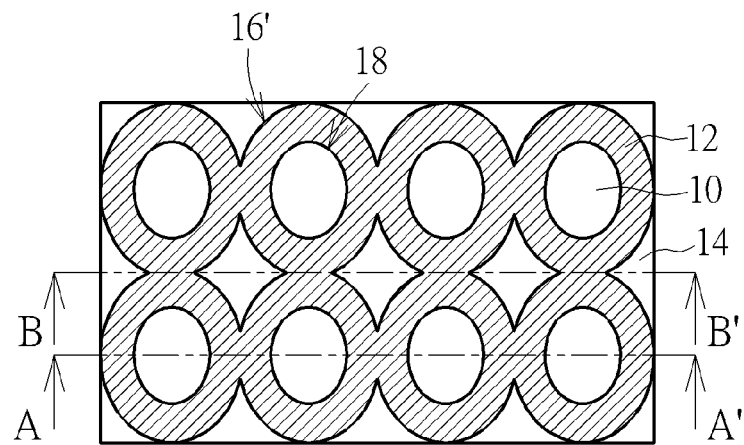
Figure 3A:
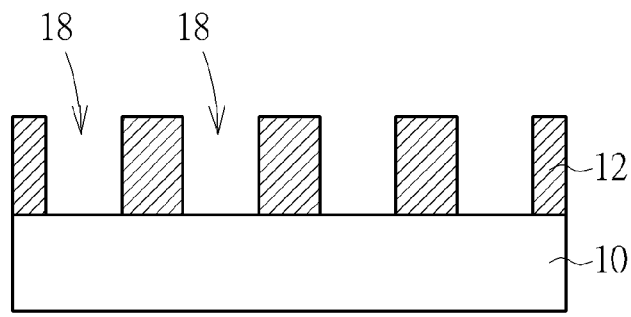
Figure 3B:
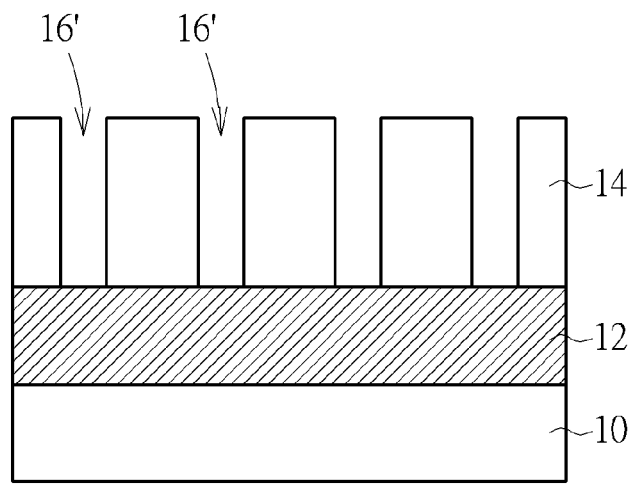
FIG. 3B, FIG. 4B, FIG. 5B and FIG. 6B depict the cross-sectional views taken along line BB' in FIG. 3 to FIG. 6 respectively.
Figure 4:
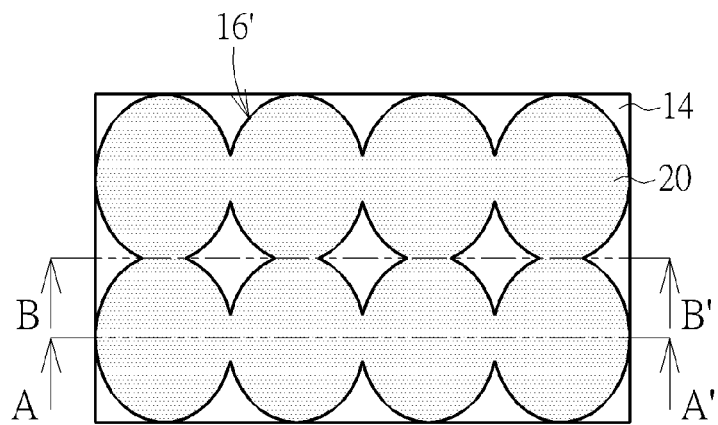
Figure 4A:
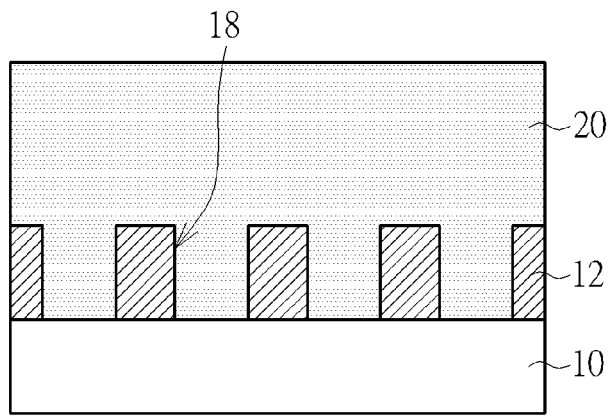
Figure 4B:
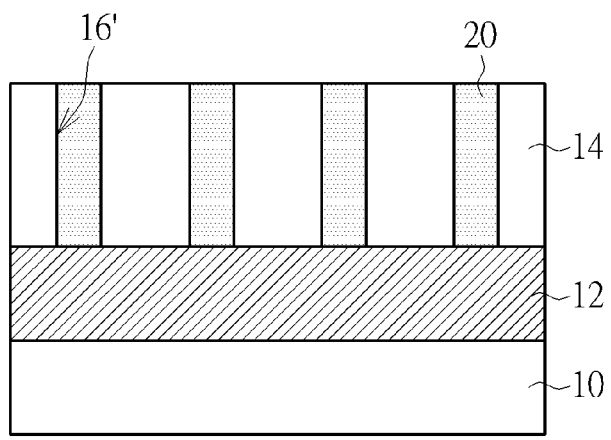

As shown in FIG. 3, FIG. 3A and FIG. 3B, all of the holes 16 in patterned photoresist layer 14 are widened to form widened holes 16'. The widened holes 16' are advantageously formed by a trimming process and all of the widened holes 16' communicate together. The hard mask 12 is exposed through the widened holes 16'. The patterned photoresist layer 14, the hard mask 12 and the substrate 10 form a step profile (not shown). As shown in FIG. 4, FIG. 4A and FIG. 4B, a filler 20 is then formed blanketly to cover the patterned photoresist layer 14 and fills up the widened holes 16' and the holes 18. Next, the filler 20 is etched back to align a top surface of the filler 20 with a top surface of the patterned photoresist layer 14. The filler 20 may be silicon nitride, silicon oxide, silicon oxynitride or other suitable materials. It is noteworthy that the filler 20 and the hard mask 12 are made of different materials. Preferably, the filler 20 has a high etching selectivity ratio relative to the hard mask 12.

Figure 5:
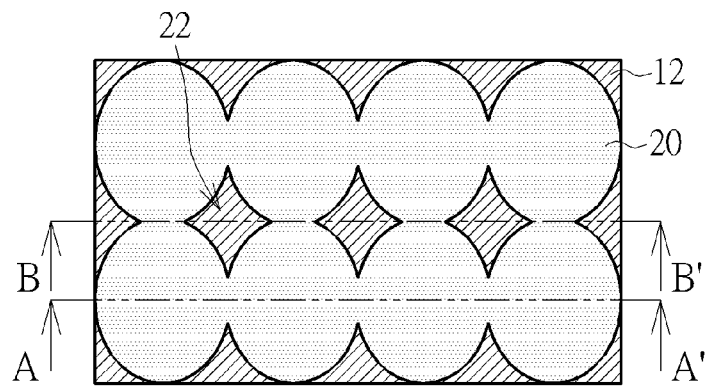
Figure 5A:
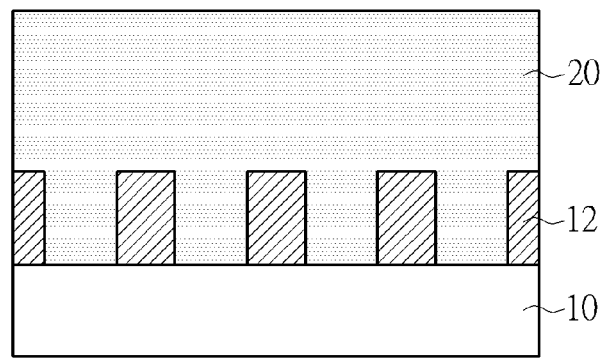
Figure 5B:
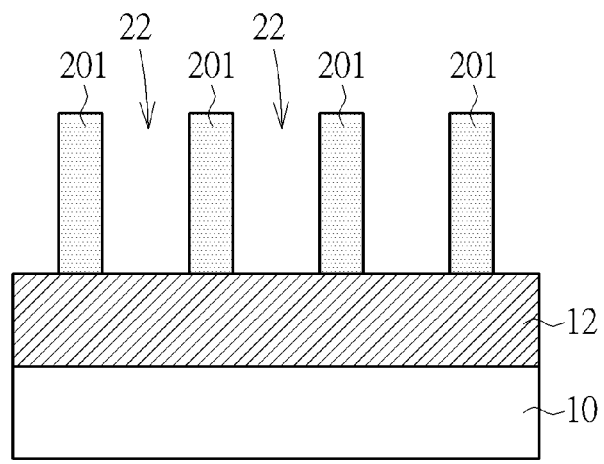
Figure 6:
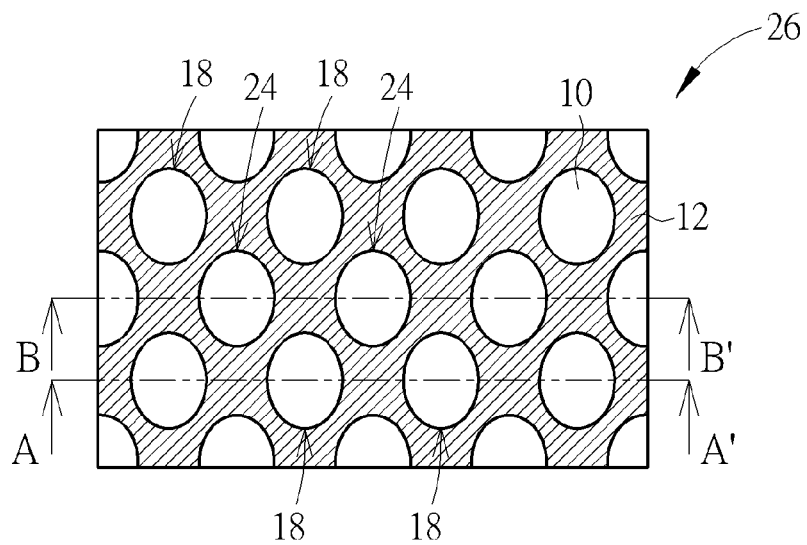
Figure 6A:
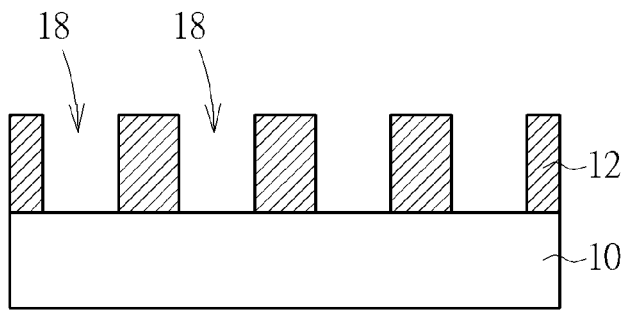
Figure 6B:
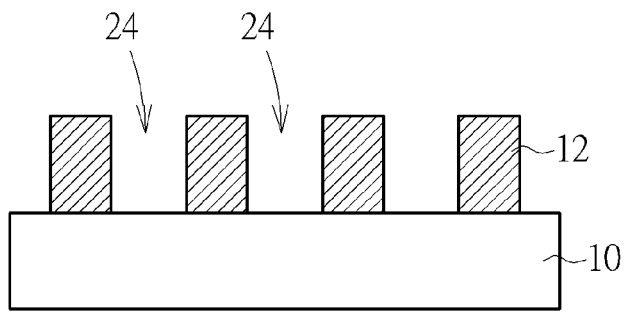

Refer now to FIG. 5, FIG. 5A and FIG. 5B. The patterned photoresist layer 14 is removed entirely, and part of the hard mask 12 is exposed through the filler 20. More specifically, as shown in FIG. 5 and FIG. 5B, after the patterned photoresist layer 14 is entirely removed, the filler 20 forms several pillars 201, and a hole 22 is defined by four of the pillars 201. The hard mask 12 is exposed through the hole 22. As shown in FIG. 6, FIG. 6A and FIG. 6B, the exposed hard mask 12 is removed by taking the filler 20 as a mask to form numerous holes 24 in the hard mask 12. The holes 24 may be circular, rectangular, polygonal or other suitable shapes. Please refer to FIG. 6. The holes 18 and the holes 24 form a staggered pattern 26 on the hard mask 12. Furthermore, at least one hole 24 is surrounded by four holes 18. According to another preferred embodiment of the present invention, there can be two hole 24 surrounded by four holes 18. Later, the filler 20 is removed entirely. The staggered pattern 26 can then be transferred to form a dense pattern (not shown) on the substrate 10. The dense pattern also includes numerous holes which may be used to form trench capacitors, contact plugs or other semiconductor devices. The holes in the substrate 10 may be circular, rectangular, polygonal or other suitable shapes.

Since a conventional scanner tool has its resolution limitation, a dense pattern having a certain pitch under the resolution limitation of the scanner tool cannot be formed by a single shot. Traditionally, at least two photo masks are needed for making the dense pattern, which is time consuming and expensive. This disclosure therefore utilizes a different strategy from the prior art technique. By using the method of the present invention, the dense pattern can be formed by a single photo mask and a single shot. As there is a single shot only, the misalignment is reduced, which decreases the amount of defects in the products.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of fabricating a semiconductor device, comprising:
    providing a substrate covered by a hard mask and a patterned photoresist layer, wherein the patterned photoresist layer comprises at least four first holes arranged in two rows and two columns;
    removing part of the hard mask to form at least four second holes in the hard mask by taking the pattered photoresist layer as a mask;
    widening each of the first holes;
    filling up the widened first holes and the second holes with a filler;
    removing the patterned photoresist layer entirely and exposing part of the hard mask;
    removing part of the hard mask to form at least a fourth hole by taking the filler as a mask; and
    removing the filler entirely.

2. The method of fabricating a semiconductor device of claim 1, wherein after each of the first holes is widened, all the widened first holes connect and the hard mask is exposed through the widened first holes.

3. The method of fabricating a semiconductor device of claim 1, wherein after the patterned photoresist layer is removed entirely, the filler forms four pillars, a third hole is defined by the four pillars and the hard mask is exposed through the third hole.

4. The method of fabricating a semiconductor device of claim 1, wherein the fourth hole is surrounded by the four second holes.

5. The method of fabricating a semiconductor device of claim 1, further comprising:
    after the filler is removed entirely, etching the substrate by taking the hard mask as a mask.

6. The method of fabricating a semiconductor device of claim 1, wherein the hard mask and the filler are made of different materials.

7. A method of fabricating a semiconductor device, comprising:
    providing a hard mask covered by a patterned photoresist layer, wherein the patterned photoresist layer comprises a plurality of first holes arranged in a plurality of rows and a plurality of columns;
    partly removing the hard mask by taking the patterned photoresist layer as a mask to form a plurality of second holes arranged in a plurality of rows and a plurality of columns in the hard mask;
    widening the first holes to make widened first holes wherein all the widened first holes connect;
    filling a filler in the widened first holes and the second holes;
    removing the patterned photoresist layer entirely and exposing the hard mask; and
    removing the hard mask layer partly by taking the filler as a mask to form a plurality of third holes in the hard mask.

8. The method of fabricating a semiconductor device of claim 7, wherein the first holes and the third holes form a staggered pattern.

9. The method of fabricating a semiconductor device of claim 7, further comprising removing the filler entirely after the third holes are formed.

10. The method of fabricating a semiconductor device of claim 7, wherein the hard mask and the filler are made of different materials.

* * * * *